United States Patent [19]
Maghsoudnia

[11] Patent Number: 6,090,678
[45] Date of Patent: Jul. 18, 2000

[54] I. C. THIN FILM PROCESSING AND PROTECTION METHOD

[75] Inventor: Mozafar Maghsoudnia, San Jose, Calif.

[73] Assignee: Analog Devices, Inc., Norwood, Mass.

[21] Appl. No.: 09/092,684

[22] Filed: Jun. 5, 1998

[51] Int. Cl.[7] .................................................. H01L 21/20
[52] U.S. Cl. ......................................... 438/382; 438/238
[58] Field of Search .................................... 438/382, 384, 438/385, 238, 660, 655, 649, 682

[56] References Cited

U.S. PATENT DOCUMENTS

| | | | |
|---|---|---|---|
| 4,760,369 | 7/1995 | Tiku | 438/384 |
| 5,420,063 | 5/1995 | Magsoudnia et al. | 438/384 |
| 5,457,062 | 10/1995 | Keller et al. | 438/384 |
| 5,618,749 | 4/1997 | Takahashi et al. | 438/384 |
| 5,780,333 | 7/1998 | Kim | 438/238 |

OTHER PUBLICATIONS

Douglas J. Hamilton, William G. Howard, *Basic Integrated Circuit Engineering*, McGraw–Hill, Inc. 1975, pp. 8–12.
Alan B. Grebene, *Bipolar and MOS Analog Integrated Circuit Design*, John Wiley & Sons, 1984, pp. 22–26.

*Primary Examiner*—Tuan H. Nguyen
*Attorney, Agent, or Firm*—Koppel & Jacobs

[57] ABSTRACT

A novel I.C. processing scheme for the fabrication of thin film features eliminates the wet etching step previously required, reducing the chip's minimum metal spacing and improving component matching capabilities and reliability. A thin film material is deposited and patterned, prior to a contact mask or platinum sputter/sinter/strip step, followed by the deposition of a protective layer. Contact mask and silicide metallization steps create contacts to the substrate, and a second contact mask step creates openings to the thin film features. The protective layer covering the thin film material allows a dry etch to be used for the final metal etch step, eliminating the need for a wet etch step and its attendant problems. The process requires no new design rules, and is easily adapted to existing products.

12 Claims, 5 Drawing Sheets

I. C. THIN FILM PROCESSING AND PROTECTION METHOD

BACKGROUND OF THE INVENTION

1. Field of the Invention

This invention relates to the field of integrated circuit (I.C.) fabrication methods, and particularly to methods of protecting features formed with thin film processes.

2. Description of the Related Art

"Thin film" processing is used to create structures or features on an integrated circuit wafer from a thin layer of material that has been deposited on top of an oxide layer formed on a substrate. Resistors, for example, are commonly fabricated using thin film techniques.

Present thin film processing methods, discussed, for example, in A. Grebene, *Bipolar and MOS Analoa Circuit Design,* John Wiley & Sons (1984) pp. 22–26, possess several inherent characteristics that can adversely affect the performance of the resistors they are used to create. Thin film resistors, particularly those made from silicon chromium carbide (SiCrC), are fabricated per the following "back-end" process steps, i.e., steps performed after an I.C.'s active devices have been formed:

1. Contact Mask. With an oxide layer formed atop a silicon substrate, a contact mask step opens holes in the oxide where metal is to make contact to the silicon, for connection to the diffused terminals of a transistor, for example.

2. Sputter Platinum/sinter/strip. This step forms platinum silicide ($PtSi_2$) wells at the bottom of the contact openings made in step 1. First, platinum is sputtered on the wafers. Next, a sinter is performed in which the platinum is annealed at about 500° C. for about 30 minutes in dry nitrogen ($N_2$). During anneal, the platinum reacts with the silicon substrate and forms the $PtSi_2$ wells. After anneal, unreacted platinum is stripped, typically with a solution containing hydrochloric acid (HCl) and nitric acid ($HNO_3$).

3. Sputter Thin Film (TF). Here, the actual resistor material, typically SiCrC, is sputtered on the wafer.

4. Sputter Titanium Tungsten (TiW) and Aluminum Silicon Copper (AlSiCu). TiW is sputtered first, to provide a thin (~900 Å) barrier layer under the metal which helps with electromigration and current density, as well as improving the contacts to the TF resistor material. AlSiCu is then sputtered on top of the TiW; it is the primary metal and carries the resistor current.

5. Metal 1 Mask. This step dry etches AlSiCu, TiW and SiCrC according to the metal 1 mask pattern to define the chip's metal traces and the resistor boundaries.

6. Thin Film Open Mask (TFOP). AlSiCu and TiW over the resistors are wet etched with hydrogen peroxide. This step removes material all the way down to the resistor's surface. A wet etch must be used because a dry etch would cause severe damage to the thin film resistor defined in step 5.

This process suffers from a number of problems, some of which arise due to the necessity of using a wet etchant such as hydrogen peroxide to etch the excess TiW in step 6. Since it is a wet etchant, it will undercut the TiW which is intended to remain as a barrier material for the resistor contacts. The degree of undercutting is very difficult to control in a manufacturing environment, so that a resistor's length—which is defined by the TiW contact areas at its two ends—becomes somewhat unpredictable. The undercutting produces non-uniformity between resistors that impacts resistor accuracy and matching, and can cause ragged edges which further complicate matching. Also, etching TiW in smaller "cuts", i.e., small open areas in the TFOP masking layer, can be difficult. Particularly for wafers with a high degree of surface tension, cuts which do not open up from a wet etch are common. This leaves some residual TiW in the small cuts after the TFOP etch, which can result in resistor matching problems. These wet etch-induced problems also tend to increase the minimum spacing that can be tolerated between metal traces.

Another problem arises by performing the thin film sputter step after the $PtSi_2$ wells are created. Exposing $PtSi_2$ to the thin film sputter will cause it to be partially etched away and thinned down, particularly in the contact area's corners where there is a higher electric field. Because the $PtSi_2$ improves contact to the silicon, this sequence of steps can degrade the quality of the connections to the chip's active devices.

SUMMARY OF THE INVENTION

A novel I.C. processing scheme for the fabrication of thin film structures is presented which avoids the problems noted above. The wet etching step previously required is eliminated, reducing the minimum metal spacing while improving matching capabilities and reliability. The process requires no new design rules, and is easily adapted to existing products.

The new thin film process follows a novel process sequence that includes the deposition of a protective layer over the thin film material that maintains the integrity of defined thin film features. First, the thin film material is deposited and patterned, so that the desired thin film features are defined prior to the performance of a contact mask or platinum sputter/sinter/strip step. This is followed by the deposition of a protective layer, preferably PECVD oxide, over the defined features. Contact mask and silicide metallization steps are performed to create contacts to the silicon substrate. A contact mask step for creating openings to the thin film features is performed next, followed by TiW and AlSiCu sputter steps. Because of the protective layer covering the surface of the thin film features, a dry etch can be used to perform the final metal etching step. The need for a wet etch step, and its attendant problems, is eliminated. The protective layer remains permanently in place over the resistor (except in the contact areas).

Eliminating the wet etch step allows the minimum metal spacing to be reduced to the limits of the lithography. It also eliminates the possibility of TiW undercutting, improving reliability, accuracy and matching capabilities, while cost and processing time remain comparable to prior art methods.

Further features and advantages of the invention will be apparent to those skilled in the art from the following detailed description, taken together with the accompanying drawings.

BRIEF DESCRIPTION OF THE DRAWINGS

FIGS. 1*a*–9*a* are top plan views illustrating the method of forming thin film features on an I.C. wafer per the present invention.

FIGS. 1*b*–9*b* are cross-sectional views corresponding to the plan views in FIGS. 1*a*–9*a*, respectively, cut along section lines 1*b*—1*b* to 9*b*—9*b*, respectively.

DETAILED DESCRIPTION OF THE INVENTION

A new method of creating thin film features and structures which provides improved definition, accuracy, matching capability and reliability, is shown in the series of plan views depicted in FIGS. 1a–9a and their respective corresponding cross-sectional views in FIGS. 1b–9b.

A thin film feature is typically formed atop an oxide layer that is formed on an I.C. wafer's substrate material. Silicon (Si) is the most commonly used substrate material, with thin film features typically formed on a silicon dioxide ($SiO_2$) layer. The discussion that follows presumes the use of an Si substrate and $SiO_2$ oxide layer, though, as discussed in more detail below, the method is not limited to use with these materials.

Figure 1A:
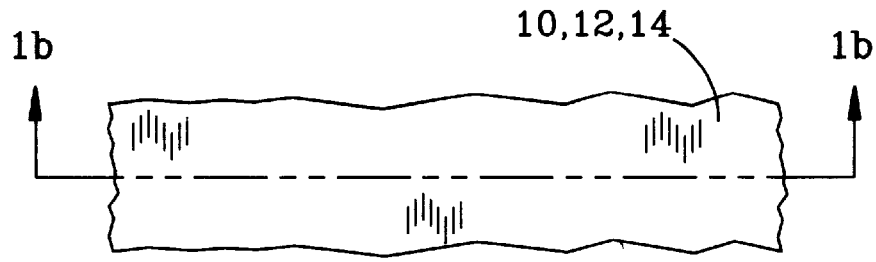
Figure 1B:
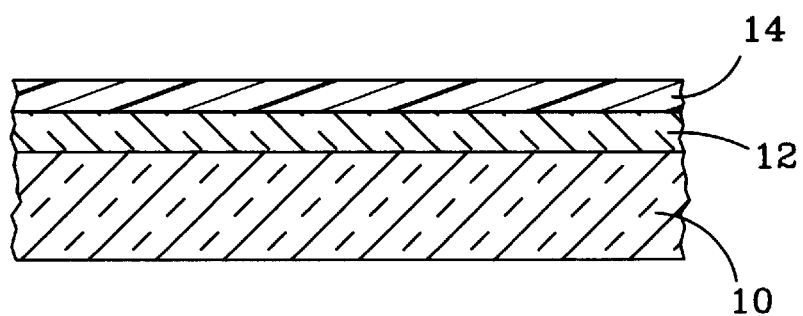

In FIGS. 1a and 1b, a substrate 10 is covered with an oxide layer 12, and a thin film material layer 14 has been deposited on the oxide layer, preferably by sputtering. Typical thin film materials to which the present method is applicable include silicon chromium carbide (SiCrC), silicon-chromium (SiCr) and nickel-chromium (NiCr), which are the materials most often used to fabricate thin film resistors. The inventive process is not limited to use with these thin film materials—the particular thin film material used is typically driven by an application's temperature coefficient and target sheet rho requirements.

Figure 2A:
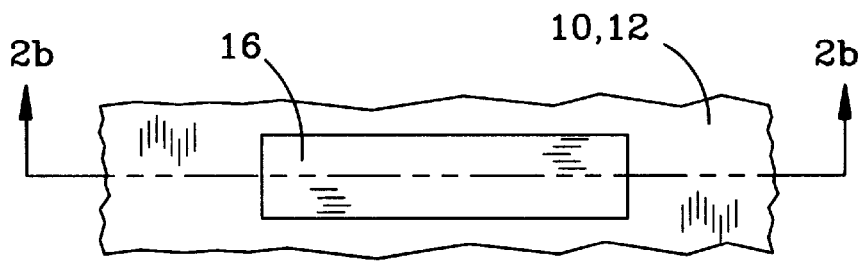
Figure 2B:
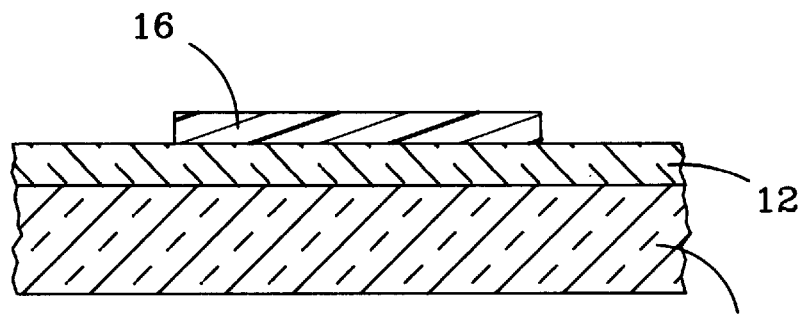

In FIGS. 2a and 2b, a patterning step has been performed to define the desired thin film features in thin film layer 14, such as a thin film resistor 16. With this novel process, defining the thin film features is one of the first process steps, in contrast to the prior art method outlined above in which the defining of the thin film resistors was the last step performed. Well-known photolithographic techniques, typically involving the etching away of materials not protected by a mask, are used to define the thin film features, as well as for the contact openings and metallization steps discussed below; such photolithographic techniques are discussed, for example, in Hamilton & Howard, *Basic Integrated Circuit Engineering*, McGraw-Hill, Inc. (1975), pp. 8–12.

Figure 3A:
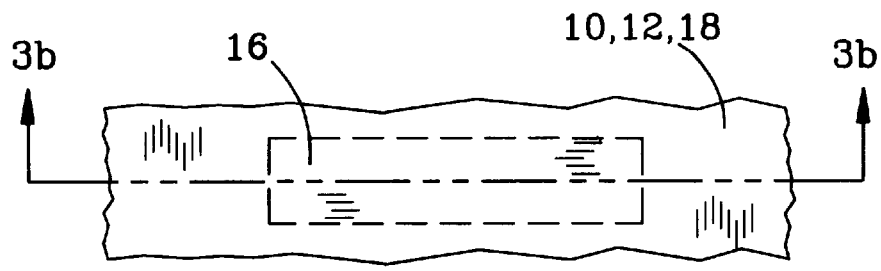
Figure 3B:
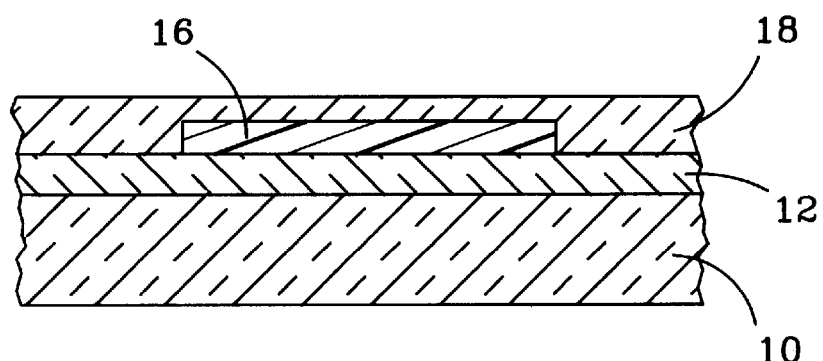

In FIGS. 3a and 3b, a protective layer 18 is deposited over the surface of the wafer, which completely covers the defined thin film features. The protective layer serves to preserve the definition of the thin film features as the remaining process steps are performed. That is, the thin film features' length, width, thickness and physical integrity are maintained essentially constant by the protective layer as the wafer undergoes subsequent process steps. The protective layer 18 is preferably a thin layer of low temperature oxide deposited via plasma enhanced chemical vapor deposition (PECVD). A PECVD oxide layer of about 1 kÅ, deposited at a temperature of about 400° C., is preferred. Other materials can be used to provide the protective layer, such as a conventional $SiO_2$ layer, but PECVD oxide is preferred because is it subjects the thin film feature being protected to a low level of stress, and because of its low deposition temperature.

Figure 4A:
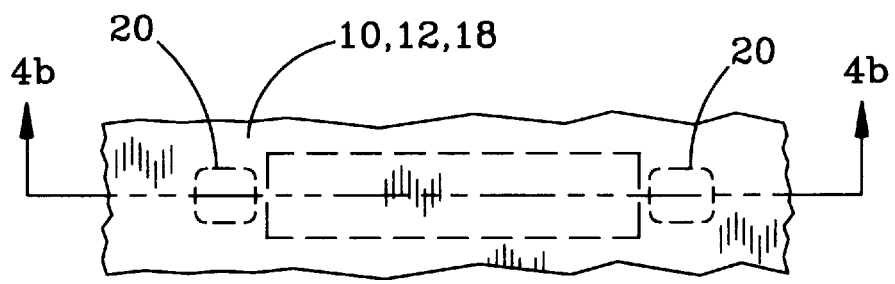
Figure 4B:
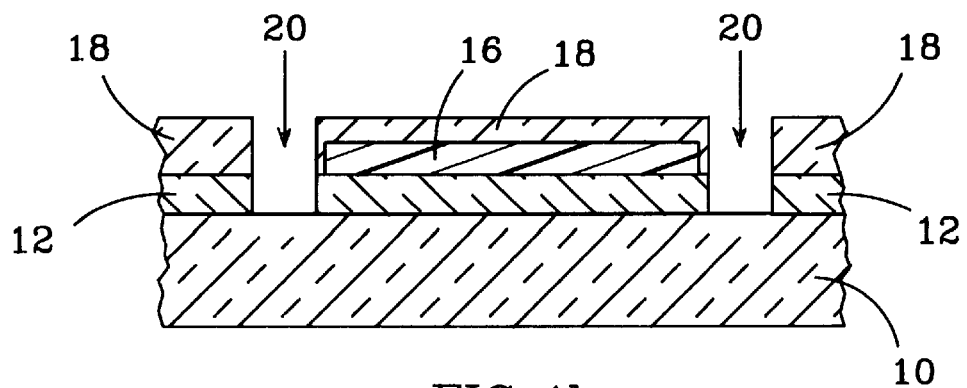

In FIGS. 4a and 4b, a contact masking step is performed to open up contact areas 20 through the protective layer 18 and the oxide layer 12 to the substrate 10. Thin film resistor 16 remains encapsulated by protective layer 18. Contact areas 20 provide access to the terminals of other devices that have been fabricated on the wafer, such as the diffused terminals of a transistor.

Figure 5A:
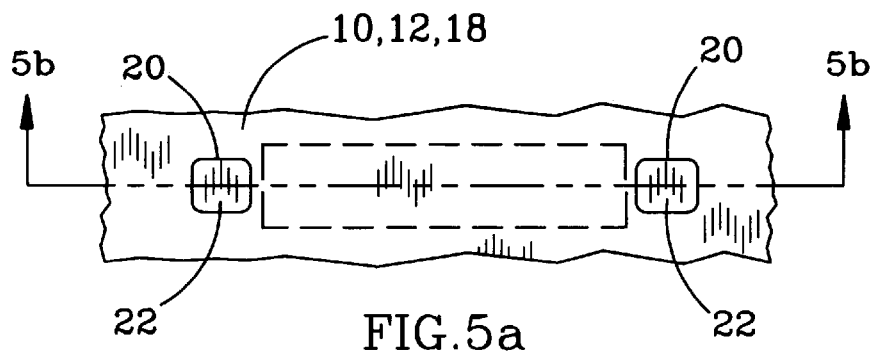
Figure 5B:
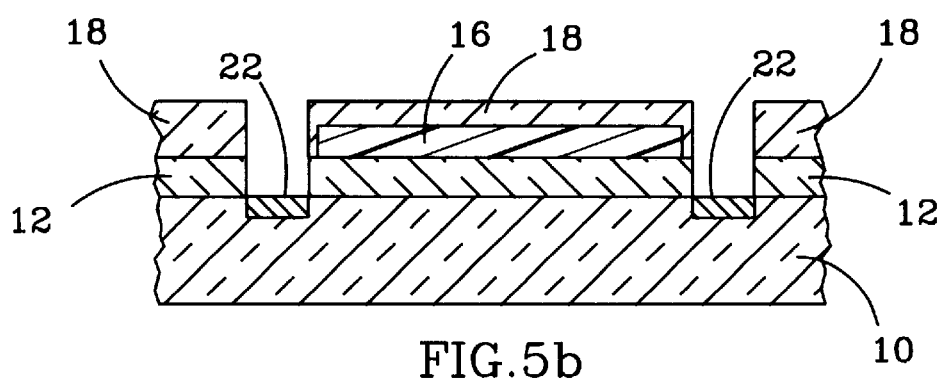

A silicide metallization step is performed next. A conductive material layer, typically metal, is deposited, sintered, and stripped to metallize the open contact areas, as shown in FIGS. 5a and 5b. The metal, preferably platinum (Pt), is preferably deposited by being sputtered onto the wafer. The metal is then sintered, preferably by annealing the Pt at approximately 500° C. for about 30 minutes in a dry nitrogen ($N_2$) atmosphere. During the anneal, Pt that comes in contact with the substrate 10 reacts with it to form platinum silicide ($PtSi_2$) (assuming a silicon substrate); the resultant $PtSi_2$ "wells" 22 reduce contact resistance. After anneal, unreacted Pt is stripped, preferably using a mixture containing HCl and $HNO_3$, leaving metal only in the contact areas 20. Though $PtSi_2$ is the most commonly used silicide in contact areas, other silicides could be used as well.

Figure 6A:
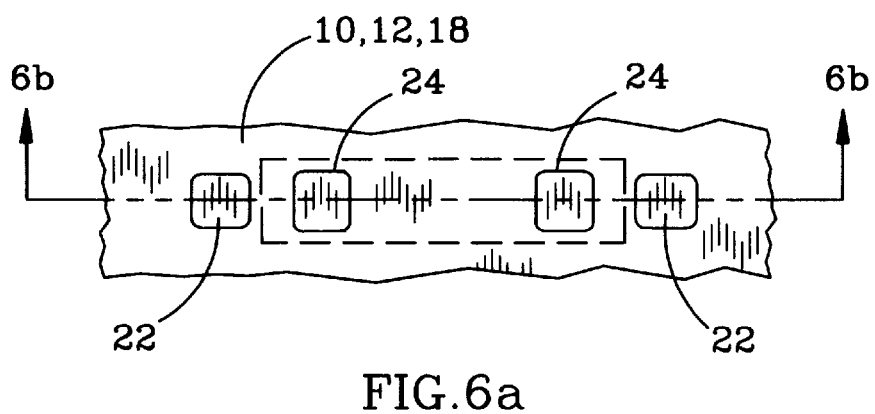
Figure 6B:
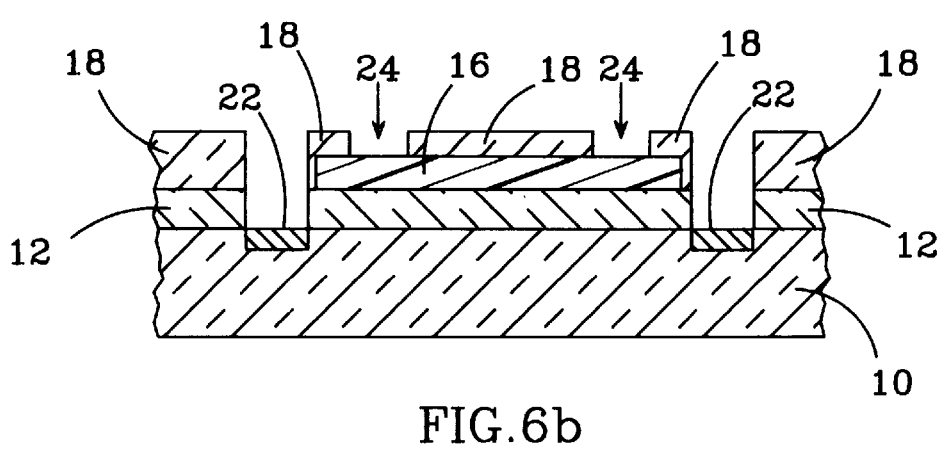

In FIGS. 6a and 6b, a contact masking step is performed to open up contact areas 24 through the protective layer 18 to the thin film resistor 16.

Figure 7A:
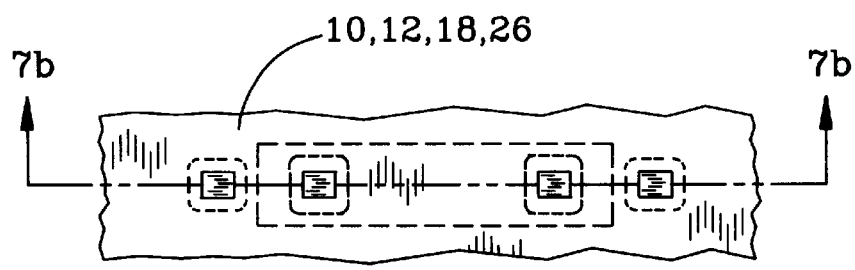
Figure 7B:
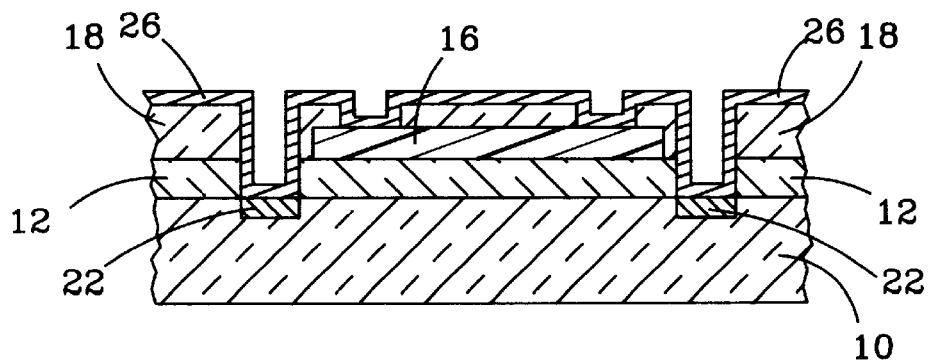

In FIGS. 7a and 7b, a barrier material 26, preferably titanium tungsten (TiW), is deposited on the wafer, preferably by sputtering. The TiW layer, preferably about 900 Å thick, serves several purposes. It helps reduce electromigration and improve current density, and it improves the quality of the contacts to the thin film resistor 16. Because TiW will not adhere directly to silicon, the $PtSi_2$ wells 22 in contact areas 20 serve as a glue layer, enabling the barrier material 26 to be securely adhered to the substrate 10. TiW is the preferred barrier material because it provides a superior thin film resistor noise characteristic; however, other barrier materials could be used as well, or, in some applications, dispensed with altogether.

Figure 8A:
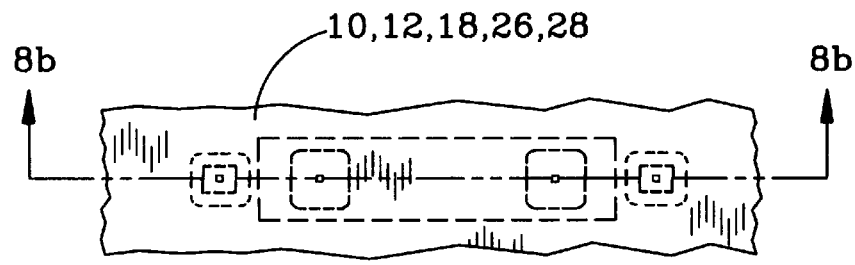
Figure 8B:
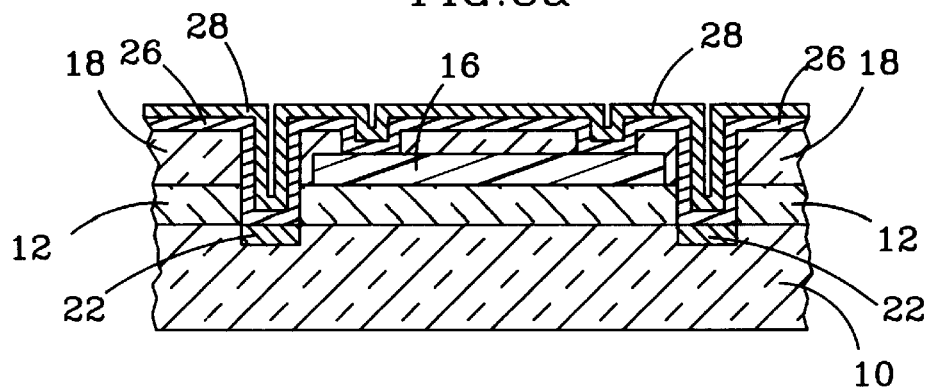

A metal layer 28, preferably aluminum silicon (1%) copper (0.5%) (AlSiCu) is deposited on the barrier material 26 in FIGS. 8a and 8b, preferably by sputtering. This metal layer is commonly referred to as the "metal 1" layer.

Figure 9A:
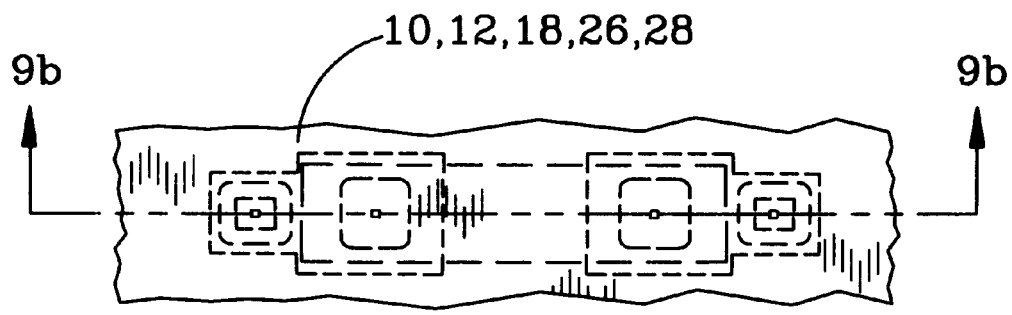
Figure 9B:
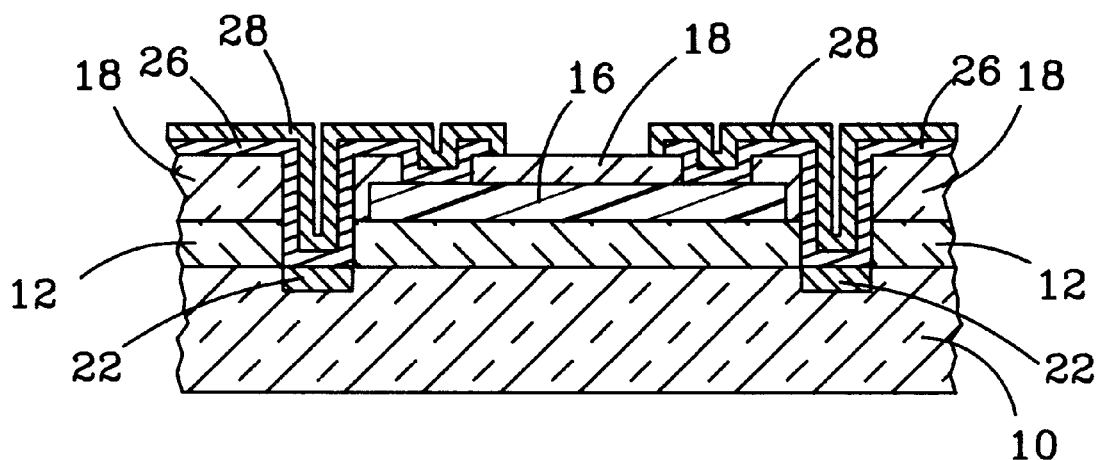

In FIGS. 9a and 9b, a masking step is performed to define the metal traces to contact areas 20 and 24, in which unneeded TiW and AlSiCu are dry etched from the wafer surface. This completes the novel process.

The metallization layer 28 shown in FIGS. 9a and 9b is merely illustrative. The ends of thin film resistor 16 are shown connected to the silicon contacts 22, as they might if the resistor were connected between the terminals of two transistors. However, the thin film resistor 16 need not be connected to silicon contacts 22, and the metal traces to the resistor and the metal traces to the silicon can be completely independent.

As used herein, "dry" etching refers to a number of non-fluid etching methods, including, for example, plasma etching. In the prior art process, if a dry etch step were to be used to remove the unneeded TiW and AlSiCu, severe damage to the thin film material would result; a wet etch is used to prevent such damage, which can cause the additional problems outlined above. For the present process, however, the defined thin film feature 16 is protected by protective layer 18, enabling the use of the dry etch and thereby avoiding the undercutting, reliability and matching problems associated with the wet etchant.

As noted above, the use of a wet etchant, typically hydrogen peroxide, can cause undercutting, which can disturb the definition of an IC's thin film features. Because the novel process eliminates the need for a wet etchant, the minimum metal spacing can be reduced to the limits of the lithography. Also, because the thin film material is deposited before any contact areas are opened, the $PtSi_2$ wells are not subjected to a contact-degrading thin film sputter.

The new process described herein does not require any additional design rules or complex processing steps. As such, it can be easily adapted to the fabrication of existing products that currently use the prior art method, with little impact on fabrication cost or time.

Though the present process has described the fabrication of thin film features on a silicon substrate, the process is useful with other substrate materials as well, including, for example, polysilicon or gallium arsenide. In addition, although the fabrication of a thin film resistor was described and shown, the process sequence described herein is also applicable to the fabrication of other thin film components, including, for example, thin film capacitors and transistors.

While particular embodiments of the invention have been shown and described, numerous variations and alternate embodiments will occur to those skilled in the art. Accordingly, it is intended that the invention be limited only in terms of the appended claims.

What is claimed is:

1. A method of fabricating thin film integrated circuit (I.C.) features, comprising the steps of:

depositing a thin film material on an I.C. substrate, patterning said thin film material to establish a desired pattern of thin film features on said I.C. substrate, depositing a protective layer on the patterned thin film material, opening contact areas to said substrate through said protective layer, depositing metal in said contact areas opened to said substrate to provide connections to devices formed on said substrate, sintering said metal, opening contact areas to said patterned thin film material through said protective layer, depositing conductive material on said protective layer and in said contact areas opened to said patterned thin film material, and dry etching excess conductive material to form a desired metallization pattern which contacts said patterned thin film material.

2. The method of claim 1, wherein said thin film features are thin film resistors.

3. The method of claim 1, wherein said thin film material is silicon chromium carbide (SiCrC).

4. A method of fabricating thin film integrated circuit (IC) structures, comprising the steps of:

sputtering a thin film material comprising silicon chromium carbide (SiCrC) on a first oxide layer formed on an integrated circuit substrate, masking and etching said thin film material to define thin film structures on said wafer, depositing a protective oxide layer on said thin film material, opening contact areas in said protective oxide layer and said first oxide layer to said substrate, sputtering a first metal on said protective oxide layer and into said areas opened in said protective oxide layer and said first oxide layer to said substrate, sintering said first metal, stripping any of said first metal that did not react with said substrate, opening contact areas in said protective oxide layer to said thin film structures, sputtering a barrier material onto said protective oxide layer and into said areas opened in said protective oxide layer to said thin film structures, sputtering a second metal on said barrier material, and dry etching said second metal and said barrier material to define metal traces to said thin film contact areas and said substrate contact areas, said protective oxide layer protecting said thin film structures from said dry etching.

5. The method of claim 4, wherein said thin film structures are thin film resistors.

6. The method of claim 4, wherein said protective oxide layer is deposited using plasma enhanced chemical vapor deposition (PECVD).

7. The method of claim 6, wherein said protective oxide layer deposited using PECVD has a thickness of about 1 kÅ and is deposited at a temperature of about 400° C.

8. The method of claim 4, wherein said first metal is platinum.

9. The method of claim 8, wherein said sintering is performed at about 500° C. for about 30 minutes in dry nitrogen ($N_2$).

10. The method of claim 8, wherein a mixture of hydrochloric acid and nitric acid is used to strip said unreacted platinum.

11. The method of claim 4, wherein said barrier material is titanium tungsten (TiW).

12. The method of claim 4, wherein said second metal is aluminum silicon copper (AlSiCu).

* * * * *